United States Patent
Perng et al.

[11] Patent Number: 6,066,570
[45] Date of Patent: May 23, 2000

[54] METHOD AND APPARATUS FOR PREVENTING FORMATION OF BLACK SILICON ON EDGES OF WAFERS

[75] Inventors: Dung-Ching Perng, San Jose, Calif.; David M. Dobuzinsky, Hopewell Junction, N.Y.; Ting Hao Wang, Milpitas, Calif.; Klaus Roithner, Dresden, Germany

[73] Assignees: Siemens Aktiengesellschaft, Munich, Germany; International Business Machines Corporation, Armonk, N.Y.

[21] Appl. No.: 09/209,413

[22] Filed: Dec. 10, 1998

[51] Int. Cl.[7] ..................................... H01L 21/00
[52] U.S. Cl. ..................... 438/719; 438/734; 438/743; 148/33.3
[58] Field of Search ..................... 438/719, 723, 438/734, 743, 756, 735; 216/79, 99; 148/33.3

[56] References Cited

U.S. PATENT DOCUMENTS 5,494,849 2/1996 Iyer et al. ..................... 438/693 X
4,925,809 5/1990 Yoshiharu et al. ............. 438/692 X

*Primary Examiner*—William Powell
*Attorney, Agent, or Firm*—Donald B. Paschburg

[57] ABSTRACT

A method for increasing chip yield by reducing black silicon deposition in accordance with the present invention includes the steps of providing a silicon wafer suitable for fabricating semiconductor chips, depositing a first layer over an entire surface of the wafer, removing a portion of the first layer to expose a region suitable for forming semiconductor devices and etching the wafer such that a remaining portion of the first layer prevents redeposition of etched material on the wafer. A semiconductor assembly for reducing black silicon deposition thereon, includes a silicon wafer suitable for fabricating semiconductor chips, the wafer having a front surface for forming semiconductor devices, a back surface and edges. A deposited layer is formed on the wafer for covering the back surface and the edges such that redeposition of silicon on the back surface and edges of the wafer during etching is prevented.

20 Claims, 2 Drawing Sheets

METHOD AND APPARATUS FOR PREVENTING FORMATION OF BLACK SILICON ON EDGES OF WAFERS

BACKGROUND

1. Technical Field

This disclosure relates to semiconductor devices and more particularly, to a method and apparatus for preventing formation of black silicon on wafers.

2. Description of the Related Art

Etching processes remove material from a substrate by, for example chemically reacting a portion of a surface to be removed. During etching, however, the material being etched frequently is redeposited which is generally undesirable. In the semiconductor industry, etching is used extensively in processing integrated circuit chips. Silicon wafers are used in the fabrication process of integrated circuit chips as a substrate on which semiconductor devices are formed. In integrated circuits that include memory cells, capacitors such as deep trench capacitors require etching the deep trenches into the silicon substrate. This etching typically promotes redeposition of the silicon material in other areas of the wafer. These other areas include a back surface and edges of the silicon wafer.

Black silicon is a term used to describe silicon deposits formed by etching silicon in semiconductor chips. Black silicon typically takes the form of small spikes which are usually between about 4 to 6 microns in length. These spikes often form on the exposed areas of the silicon substrate and in particular form along the outer edges of the wafer. The spikes can break away from the wafer and interfere with the formation of devices on the wafer during processing. The presence of the spikes effects chip yield.

As mentioned above, the spikes are often formed on the edges and back surface of the wafer. Conventional techniques have attempted to remove the spikes prior to additional processing by rinsing the back surface of the wafer or by performing an edge bead removal. The rinsing technique uses a fluid to rinse away the spikes formed on the wafer edges and/or the back surface. While the edge bead removal uses a mechanical process such as polishing to remove these spikes. Both techniques, however, do not insure that spikes are not present in critical areas of the chip during processing.

Therefore, a need exists for preventing the formation of black silicon during fabrication of semiconductor chips. A further need exists for increasing chip yield by the elimination of black silicon deposition.

SUMMARY OF THE INVENTION

A method for increasing chip yield by reducing black silicon deposition in accordance with the present invention includes the steps of providing a silicon wafer suitable for fabricating semiconductor chips, depositing a first layer over an entire surface of the wafer, removing a portion of the first layer to expose a region suitable for forming semiconductor devices and etching the wafer such that a remaining portion of the first layer prevents redeposition of etched material on the wafer.

In particularly useful methods of the present invention the first layer is preferably an oxide layer. The step of depositing may include depositing the first layer by low pressure vapor deposition. The step of removing may include removing the first layer by reactive ion etching. The step of forming a pad layer over the first layer and the exposed region for forming the semiconductor devices may also be included as well as the step of forming a glass layer on the pad layer. The step of etching the wafer may further include etching the wafer by reactive ion etching.

A method for processing a silicon wafer for semiconductor devices having reduced redeposition of silicon during fabrication in accordance with the invention, includes the steps of forming a first layer over an entire surface of a wafer, forming a resist layer over a first portion of the first layer to remain on the wafer, the first portion positioned over a back surface and edges of the wafer, removing a second portion of the first layer remaining exposed by the resist layer thereby exposing a front surface of the wafer suitable for forming semiconductor devices thereon and removing the resist layer.

In other methods in accordance with the present invention, the first layer is preferably an oxide layer. The step of forming the first layer may include depositing the first layer by low pressure vapor deposition. The step of removing the second portion may include removing the second portion by reactive ion etching. The step of forming a pad layer over the first layer and the exposed front surface for forming the semiconductor devices may also be included. The step of forming a glass layer over the pad layer for forming the semiconductor devices may also be included. The step of etching the wafer by reactive ion etching is also preferable.

A semiconductor assembly for reducing black silicon deposition thereon includes a silicon wafer suitable for fabricating semiconductor chips, the wafer having a front surface for forming semiconductor devices, a back surface and edges. A deposited layer is formed on the wafer for covering the back surface and the edges such that redeposition of silicon on the back surface and edges of the wafer during etching is prevented.

The deposited layer is preferably an oxide layer and more preferably TEOS. The deposited layer has a thickness preferably between about 1,000 Å and about 10,000 Å. The semiconductor devices may include deep trench capacitors. The deposited layer is preferably a low pressure deposited layer.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present disclosure relates to semiconductor devices and more particularly, to a method and apparatus for preventing formation of black silicon on wafers. The present invention prevents the formation of black silicon on exposed areas of semiconductor wafers. During fabrication, especially during etching of the silicon substrate, exposed areas are protected from redeposition of etched silicon. Exposed areas are protected by a mask layer which remains in place during the fabrication of the chip.

Figure 1:
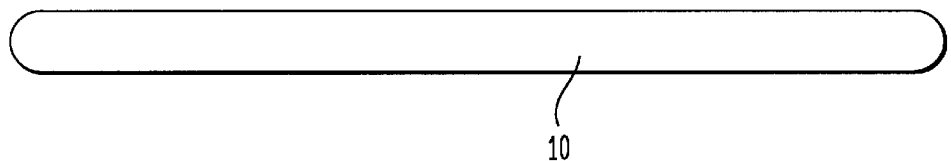
FIG. 1 is a cross-sectional view of a silicon wafer.

Referring now in specific detail to the drawings in which like reference numerals identify similar or identical elements throughout the several views, FIG. 1 shows a silicon wafer 10 used for fabricating semiconductor chips. Wafer 10 is placed on a platen (not shown) to secure wafer during processing.

Figure 2:
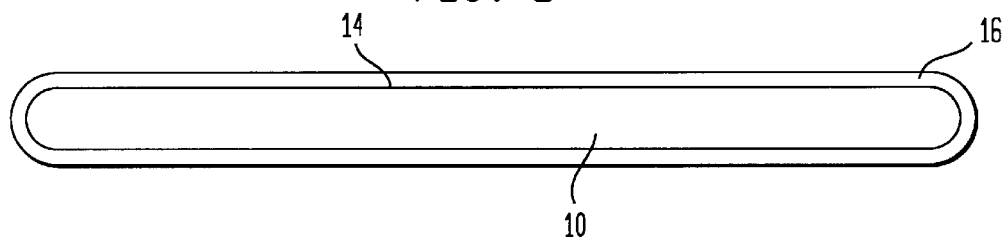
FIG. 2 is a cross-sectional view of the silicon wafer of FIG. 1 having a layer deposited thereon in accordance with the present invention.

Referring to FIG. 2, wafer 10 has a front surface 14 which is the situs for device fabrication on wafer 10. A layer 16 is formed on an entire surface of wafer 10. Layer 16 is preferably formed from an oxide such as silicon dioxide and more preferably TEOS or a thermal oxide. Alternately, a nitride, such as silicon nitride may be used, however other processes described herein would be modified accordingly. Layer 16 has a thickness from about 1,000 Å to about 10,000 Å and preferably from about 3,000 Å to about 8,000 Å. Layer 16 is deposited using a deposition process which must coat an entire surface of wafer 10 (front, back and sides as shown). In one embodiment, a low pressure chemical vapor deposition process is used to deposit layer 16. Other deposition processes may be useful for depositing layer 16 as well.

Figure 3:
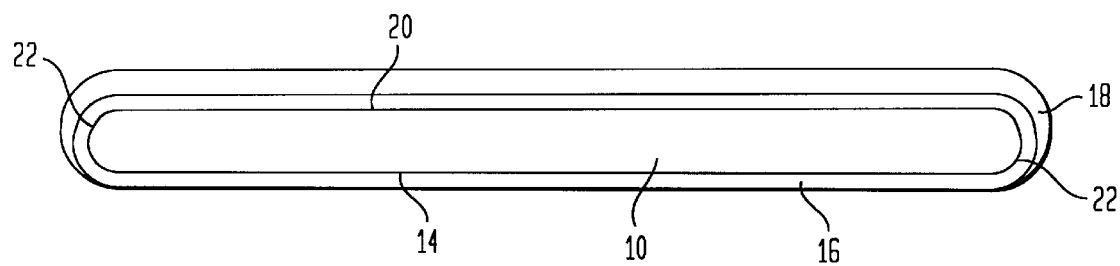
FIG. 3 is cross-sectional view of the wafer of FIG. 2 having a resist layer formed on the deposited layer over a back surface in accordance with the present invention.

Referring to FIG. 3, a resist layer 18 is deposited over a back surface 20 of wafer 10. Back surface 20 is opposite front surface 14. Therefore, it may be necessary to flip wafer 10 over to provide resist layer 18 thereon. Resist layer 18 is formed such that layer 16 is covered on back surface 20 and over edges 22 of wafer 10. Resist layer 18 may be of any material known to those skilled in the art which allows layer 16 to be selectively etched relative to resist layer 18.

Figure 4:
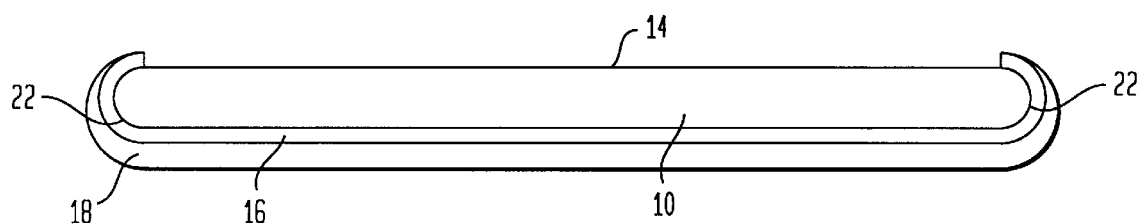
FIG. 4 is cross-sectional view of the wafer of FIG. 3 after being flipped, the wafer having a portion of the deposited layer over a front surface removed in accordance with the present invention.

Referring to FIG. 4, wafer 10 is positioned to remove layer 16 from front surface 14. This may include, once again, flipping wafer 10. A blanket etch is performed on the front surface 14 to remove a portion layer 16 that is exposed. Layer 16 is removed on front surface 14 only. The remaining portion of layer 16 remains protected by resist layer 18. The remaining portion of layer 16 covers edges 22 and back surface 20, while front surface 14 is exposed. The blanket etch process must be directional, and edges 22 must be protected. This is preferably performed by a reactive ion etching (RIE) process, or by using a shadow ring (not shown).

Figure 5:
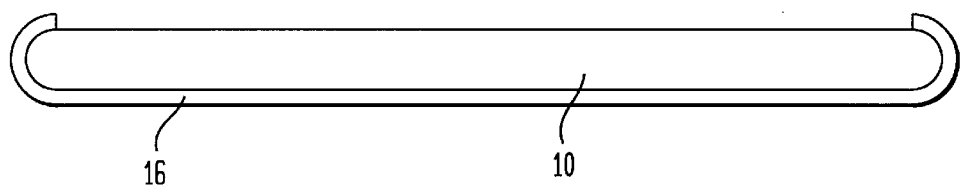
FIG. 5 is cross-sectional view of the silicon wafer of FIG. 4 having the resist layer removed in accordance with the present invention.
Figure 6:
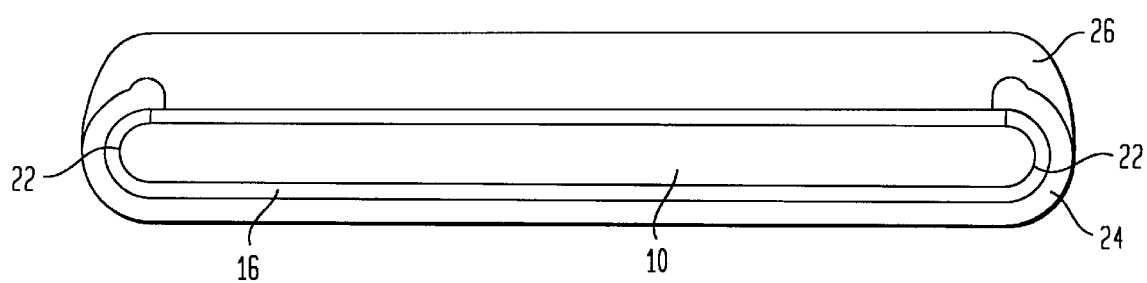
FIG. 6 is cross-sectional view of the silicon wafer of FIG. 5 having a pad layer and a glass layer formed thereon in accordance with the present invention.

Referring to FIGS. 5 and 6, resist layer 18 is removed to expose the remaining portion of layer 16. Resist layer 18 may be removed by a wet etching process. A pad layer 24 is deposited over the entire surface of wafer 10 and the remaining portion of layer 16. Pad layer 24 is preferably formed from a nitride such as silicon nitride. In the alternative, an oxide, such as a silicon oxide may be used, however other processes described herein would be modified accordingly. Layer 24 has a thickness from about 1,000 Å to about 10,000 Å and preferably from about 3,000 Å to about 8,000 Å. Layer 24 may be deposited using a low pressure deposition process, for example a low pressure chemical vapor deposition process (LPCVD).

LPCVD or other deposition processes may be useful for depositing pad layer 24. A glass layer 26 is deposited over front surface 14. Glass layer 26 may include borosilicate glass (BSG), borophosphate silicate glass (BPSG) or other glass layers known in the art.

Further processing of wafer 10 may continue using known methods. In one example for a dynamic random access memory (DRAM) chip, deep trench capacitors may be implemented for memory cells. In this case further processing includes deep trench lithography to etch glass layer 26 at trench locations on wafer 10. Wafer 10 is then etched, by for example reactive ion etching to form the deep trenches in the silicon of wafer 10.

Since the remaining portion of layer 16 remains in contact with wafer 10, redeposition of etched silicon cannot occur on wafer 10 where layer 16 remains. In this way, layer 16 functions as a mask to prevent black silicon spikes from forming on the surface of wafer. By eliminating the black silicon spikes, there is less risk that the spikes will break off and interfere with other processing steps. Therefore, chip yield will increase. The mask may be removed during a later processing step, preferably after most of the silicon etching has been performed. Further processing of wafer 10 is performed as is known in the art.

Having described preferred embodiments for a method and apparatus for preventing formation of black silicon on edges of wafers (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for increasing chip yield by reducing black silicon deposition, comprising the steps of:

providing a silicon wafer suitable for fabricating semiconductor chips;

depositing a first layer over an entire surface of the wafer;

removing a portion of the first layer to expose a region suitable for forming semiconductor devices; and etching the wafer such that a remaining portion of the first layer prevents redeposition of etched material on the wafer.

2. The method as recited in claim 1, wherein the first layer is an oxide layer.

3. The method as recited in claim 1, wherein the step of depositing includes depositing the first layer by low pressure vapor deposition.

4. The method as recited in claim 1, wherein the step of removing includes removing the first layer by reactive ion etching.

5. The method as recited in claim 1, further comprises the step of forming a pad layer over the first layer and the exposed region for forming the semiconductor devices.

6. The method as recited in claim 5, further comprises the step of forming a glass layer on the pad layer for forming the semiconductor devices.

7. The method as recited in claim 1, wherein the step of etching the wafer includes etching the wafer by reactive ion etching.

8. A method for processing a silicon wafer for semiconductor devices having reduced redeposition of silicon during fabrication, comprising the steps of:

forming a first layer over an entire surface of a wafer;

forming a resist layer over a first portion of the first layer to remain on the wafer, the first portion positioned over a back surface and edges of the wafer;

removing a second portion of the first layer remaining exposed by the resist layer thereby exposing a front surface of the wafer suitable for forming semiconductor devices thereon; and removing the resist layer.

9. The method as recited in claim 8, wherein the first layer is an oxide layer.

10. The method as recited in claim 8, wherein the step of forming the first layer includes depositing the first layer by low pressure vapor deposition.

11. The method as recited in claim 8, wherein the step of removing the second portion includes removing the second portion by reactive ion etching.

12. The method as recited in claim 8, further comprises the step of forming a pad layer over the first layer and the exposed front surface for forming the semiconductor devices.

13. The method as recited in claim 12, further comprises the step of forming a glass layer over the pad layer for forming the semiconductor devices.

14. The method as recited in claim 1, further comprises the step of etching the wafer by reactive ion etching.

15. A semiconductor assembly for reducing black silicon deposition thereon, comprising:

a silicon wafer suitable for fabricating semiconductor chips, the wafer having a front surface for forming semiconductor devices, a back surface and edges; and a deposited layer formed on the wafer for covering the back surface and the edges such that redeposition of silicon on the back surface and edges of the wafer during etching is prevented.

16. The semiconductor assembly, as recited in claim 15, wherein the deposited layer is an oxide layer.

17. The semiconductor assembly, as recited in claim 16, wherein the deposited layer is TEOS.

18. The semiconductor assembly, as recited in claim 15, wherein the deposited layer has a thickness between about 1,000 Å to about 10,000 Å.

19. The semiconductor assembly, as recited in claim 15, wherein the semiconductor devices include deep trench capacitors.

20. The semiconductor assembly, as recited in claim 15, wherein the deposited layer is low pressure deposited layer.

* * * * *